United States Patent
Monnier et al.

(10) Patent No.: US 11,869,772 B2
(45) Date of Patent: Jan. 9, 2024

(54) METHOD FOR SILICIDATION OF SEMICONDUCTOR DEVICE, AND CORRESPONDING SEMICONDUCTOR DEVICE

(71) Applicant: STMicroelectronics (Crolles 2) SAS, Crolles (FR)

(72) Inventors: Denis Monnier, Saint Ismier (FR); Olivier Gonnard, Saint-Egreve (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 230 days.

(21) Appl. No.: 17/338,379

(22) Filed: Jun. 3, 2021

(65) Prior Publication Data
US 2021/0296129 A1 Sep. 23, 2021

Related U.S. Application Data

(62) Division of application No. 16/515,805, filed on Jul. 18, 2019, now Pat. No. 11,056,342.

(30) Foreign Application Priority Data

Aug. 1, 2018 (FR) ..................................... 1857187

(51) Int. Cl.
  *H01L 29/78* (2006.01)
  *H01L 21/28* (2006.01)
  *H01L 21/8234* (2006.01)
  *H01L 21/285* (2006.01)

(52) U.S. Cl.
  CPC .... *H01L 21/28052* (2013.01); *H01L 21/2855* (2013.01); *H01L 21/28079* (2013.01); *H01L 21/823443* (2013.01)

(58) Field of Classification Search
  CPC ......... H01L 21/28052; H01L 21/28079; H01L 21/2855; H01L 21/823443
  See application file for complete search history.

(56) References Cited

U.S. PATENT DOCUMENTS

| 6,468,904 B1 | 10/2002 | Chen et al. |
| 2004/0029376 A1 | 2/2004 | Tseng et al. |
| 2015/0031179 A1 | 1/2015 | Thurmer et al. |

OTHER PUBLICATIONS

Dyatko, Nikolay A., et al., "Influence of Nitrogen Admixture on Plasma Characteristics in a dc Argon Glow Discharge and in Afterglow", Atoms, vol. 7, No. 1: 13, published Jan. 19, 2019, 17 pages.

*Primary Examiner* — Victor A Mandala
*Assistant Examiner* — Colleen E Snow
(74) *Attorney, Agent, or Firm* — Slater Matsil, LLP

(57) ABSTRACT

A exemplary semiconductor device includes a first gate structure overlying a surface of the semiconductor body, the first gate structure being silicided. A second gate structure overlies the surface of the semiconductor body and not being silicided. An oxide layer overlies the second gate structure and extends toward the first gate structure. A silicon nitride region is laterally spaced from the second gate structure and overlies a portion of the oxide layer between the first gate structure and the second gate structure.

12 Claims, 10 Drawing Sheets

METHOD FOR SILICIDATION OF SEMICONDUCTOR DEVICE, AND CORRESPONDING SEMICONDUCTOR DEVICE

CROSS-REFERENCE TO RELATED APPLICATIONS

This application is a divisional application of U.S. application Ser. No. 16/515,805, filed on Jul. 18, 2019, which claims priority to French Patent Application No. 1857187, filed on Aug. 1, 2018, which applications are hereby incorporated herein by their reference.

TECHNICAL FIELD

Embodiments and modes of implementation relate a method for silicidation of a semiconductor device.

BACKGROUND

The term "siliciding" means formation of a metal silicide on a film of a silicon compound, this part of the silicon then being silicided. Generally, the objective of siliciding is to form electrical contacts between a silicon compound and an interconnect structure of metal elements. One technique is a self-aligned silicide or "salicide." For convenience, reference will only be made to the term silicide and its derived forms.

In semiconductor device fabrication processes, siliciding is typically carried out after formations of a hardmask that leaves uncovered the parts to be silicided of the semiconductor device. Hardmasks generally comprise inert materials such as a stack of silicon oxide and silicon nitride.

So that the reaction between the metal and the silicon is clean and controlled, the parts to be silicided are cleaned. The purpose of this cleaning is to remove parasitic oxidations that have appeared at the surface of the silicon for example during phases of transporting a silicon wafer between two reactors, or to remove residues of resists used for prior masking steps.

An example of cleaning that is advantageous in this context consists in sputtering ions in a plasma environment, which has a soft etching effect.

However, it has been observed that the silicon nitride gives off nitrogen gas under the effect of such cleaning by soft etching, and this emission of gas may disturb the equilibrium of the plasma environment and interrupt the reaction.

SUMMARY

Embodiments and modes of implementation relate to the fabrication of semiconductor devices, for example, siliciding silicon surfaces of semiconductor devices intended in particular to be incorporated in a three-dimensional structure.

Modes of implementation can overcome problems related with prior techniques. Thus a stabilized reaction makes it possible to improve the quality and the yield of industrial productions of semiconductor devices.

In this regard, a process is proposed, according to one aspect, for siliciding a part to be silicided of a semiconductor device. The method comprises forming a protective layer on a part not to be silicided of the semiconductor device, the formation comprising a formation of a silicon oxide layer and of a silicon nitride layer on the silicon oxide layer. The method also comprises siliciding the part to be silicided by an ion sputtering in a plasma environment on the part to be silicided and on the part not to be silicided.

The process comprises, prior to the siliciding step, a step of removal of at least one portion of the silicon nitride layer of the protective layer.

Thus, since the protective layer comprises less material that releases molecular nitrogen, the ion sputtering in a plasma environment is not destabilized and the siliciding step does not fail.

The ion sputtering in a plasma environment can be optimized, and thus the siliciding is improved, the contacts with the silicided parts of the semiconductor device are better and the performances of the semiconductor device are increased.

The ion sputtering in a plasma environment comprises for example an argon ion sputtering in a molecular oxygen plasma environment.

According to one mode of implementation, the step of removal of at least one portion of the silicon nitride layer comprises a removal of one portion only of the silicon nitride layer so as to leave behind a remaining portion of this silicon nitride layer, and the remaining portion of the silicon nitride layer rests on a border of the silicon oxide layer at a boundary between the non-silicided part and the silicided part of the semiconductor device.

Advantageously, the step of removal of at least one portion of the silicon nitride layer is arranged so that the remaining portion of the silicon nitride layer occupies a surface area of less than 50% of the total surface area of the semiconductor device.

According to one mode of implementation, the step of forming the protective layer comprises a formation of a first mask on the part not to be silicided of the semiconductor device and a selective etching of the silicon nitride layer which is not covered by the first mask, a removal of the first mask, and a selective etching of the silicon oxide layer which is no longer covered by the silicon nitride layer.

According to one mode of implementation, the step of removal of a portion of the silicon nitride layer of the protective layer comprises a formation of a second mask on the part to be silicided of the semiconductor device, the second mask overlapping a border of the protective layer at the boundary between the part not to be silicided and the part to be silicided of the semiconductor device, and a selective etching of the silicon nitride layer which is not covered by the second mask.

In other words, it is proposed according to this mode of implementation to use a mask that is not strictly aligned with the underlying structure to remove the silicon nitride layer, which is advantageous as regards integration and yield.

For example, the siliciding step comprises a formation of a surface film of metal silicide by a physical vapor deposition of a metal, preferentially cobalt, on bare silicon surfaces that have received the ion sputtering.

According to another aspect, a semiconductor device is proposed that comprises a silicided part, and a non-silicided part covered with a silicon oxide layer, in which a portion of a silicon nitride layer rests on a border of the silicon oxide layer at the boundary between the non-silicided part and the silicided part of the semiconductor device.

A semiconductor device is understood to mean the operational integrated circuits, and also the intermediate results of integrated circuit fabrication, such as bare "chips" intended to be assembled under industrial conditions, for example having no encapsulation.

Since the metal silicide films are in a part of the semiconductor device comprising the individual electronic components, at a front face of a silicon substrate (part usually denoted by the acronym FEOL for Front End Of Line), it is clearly understood that the silicon oxide layer covering the non-silicided part is also located in the FEOL part of the semiconductor device. In other words, the silicon oxide layer is at least partially in contact with the substrate, unlike for example oxide layers typically located in the interconnect levels of the semiconductor device (usually BEOL, for Back End Of Line).

The semiconductor device according to this aspect, for example obtained by means of the process defined above, has quality silicided films, and thus reliable metal-silicon contacts, making it possible to improve the performances thereof.

According to one embodiment, an edge of the silicon nitride layer coincides with the edge of the silicon oxide layer at the boundary between the non-silicided part and the silicided part of the semiconductor device.

An image sensor integrated circuit is also proposed that comprises a semiconductor device as defined above, or obtained by a process as defined above.

BRIEF DESCRIPTION OF THE DRAWINGS

Other advantages and features of the invention will become apparent on examining the detailed description of wholly non-limiting embodiments and modes of implementation, and the appended drawings in which.

DETAILED DESCRIPTION OF ILLUSTRATIVE EMBODIMENTS

FIGS. 1 to 10 illustrate intermediate structures CIi, with $1 \leq i \leq 9$, during a step or resulting from a step of an example of a process for siliciding surfaces of a semiconductor device CI. The semiconductor device CI is for example an intermediate result of a fabrication of an integrated circuit, or more particularly a chip intended to be assembled with another chip to form a three-dimensional structure of an image sensor integrated circuit.

The figures are numbered in the order of implementation of the steps and the elements common from one figure to another bear the same references.

Figure 1:
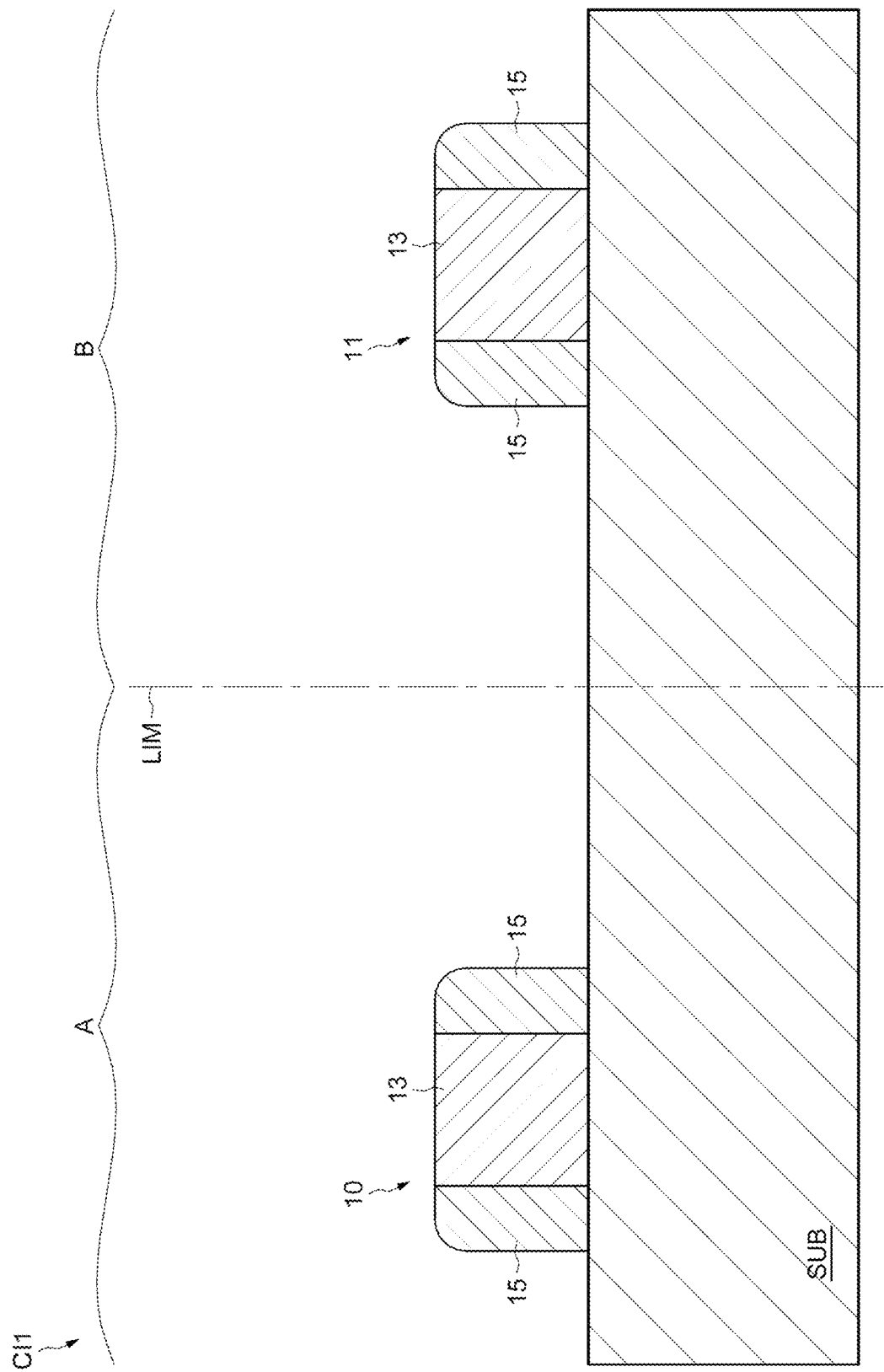
FIGS. 1 to 10 illustrate an example of a mode of implementation and embodiment of the invention.

FIG. 1 schematically represents an intermediate semiconductor device structure CI1, in a process for fabricating a semiconductor device CI.

Semiconductor device elements 10, 11 have been formed on a semiconductor substrate SUB, made of silicon. The substrate SUB may be doped in order to have P type or N type conductivity.

The semiconductor device elements 10, 11 have been represented in the style of transistors, comprising a gate element 13 flanked by insulating and spacing elements 15 (spacers), on a surface of the substrate SUB. For example, the gate elements 13 are formed of conductive polycrystalline silicon that overlies a gate dielectric.

Of course, it is possible to envisage semiconductor device elements of any type of electronic component, such as diodes, capacitors, resistors, etc.

The intermediate structure CI comprises a first part A which is intended to not be silicided, on the left in the representation of FIG. 1, and a second part B which is intended to be silicided, on the right in the representation of FIG. 1.

The part intended not to be silicided A and the part intended to be silicided B are defined by a boundary LIM. At this stage of the process, the boundary LIM is not yet established.

Figure 2:
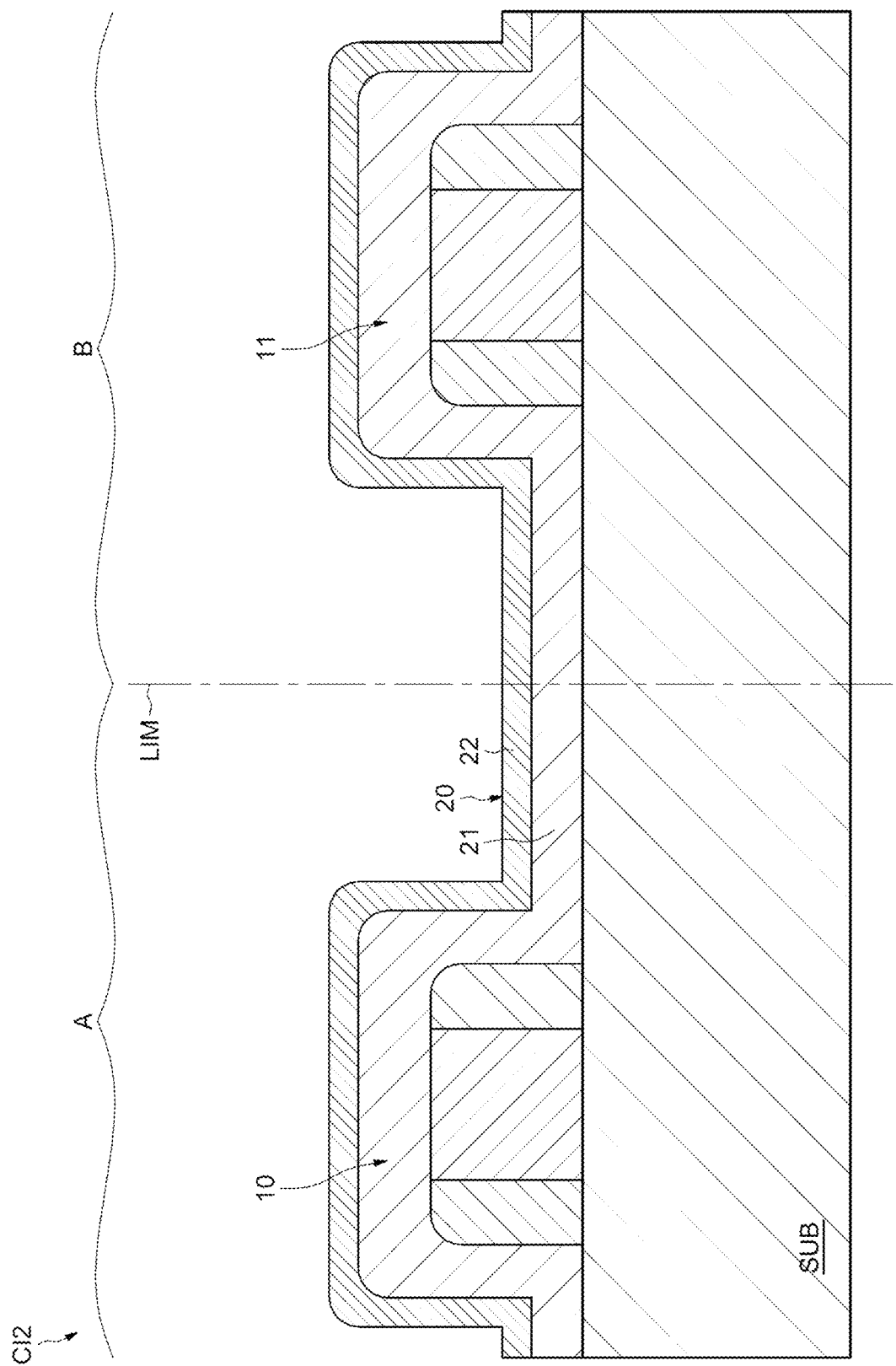

FIG. 2 represents an intermediate semiconductor device structure CI2, corresponding to the structure CI on which a protective layer 20 has been formed.

The protective layer 20 comprises a stack of a silicon nitride layer 22 on a silicon oxide layer 21.

The protective layer 20 is intended to mask the underlying surfaces of the substrate SUB and of the semiconductor device elements 10, 11 that it will cover, from a silicidation during a subsequent step.

The protective layer 20 has been formed on the entire surface of the structure CI, on the part not to be silicided A and on the part to be silicided B. The protective layer 20 rests on the upper face (or front face) of the substrate SUB and also on the semiconductor device elements 10, 11.

For example the silicon oxide layer (SiO2) may be obtained by growth of the thermal growth or vapor deposition type, and may have a thickness of the order of 20 nm.

For example the silicon nitride layer (Si3N4) may be obtained by growth of the vapor deposition type, and may have a thickness of the order of 10 nm.

Figure 3:
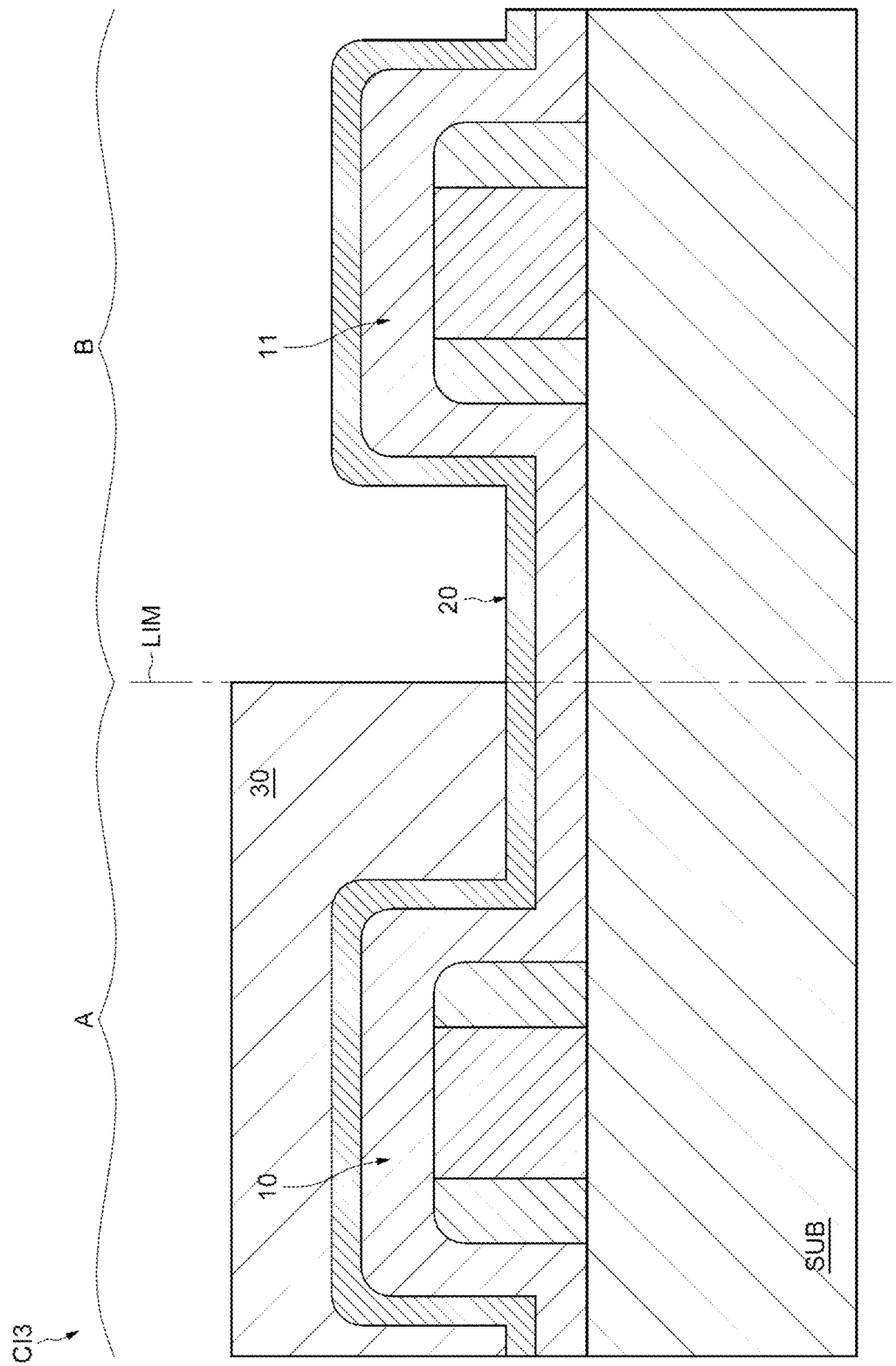

FIG. 3 represents an intermediate semiconductor device structure CI3, corresponding to the structure CI2 on which a first mask 30 has been formed.

The mask 30 has been formed by means of a lithographed photoresist, in order to cover the protective layer 20 on the part not to be silicided A and to leave uncovered the part to be silicided B.

It is via the first resist mask 30 that the boundary LIM is established between the parts A and B.

Figure 4:
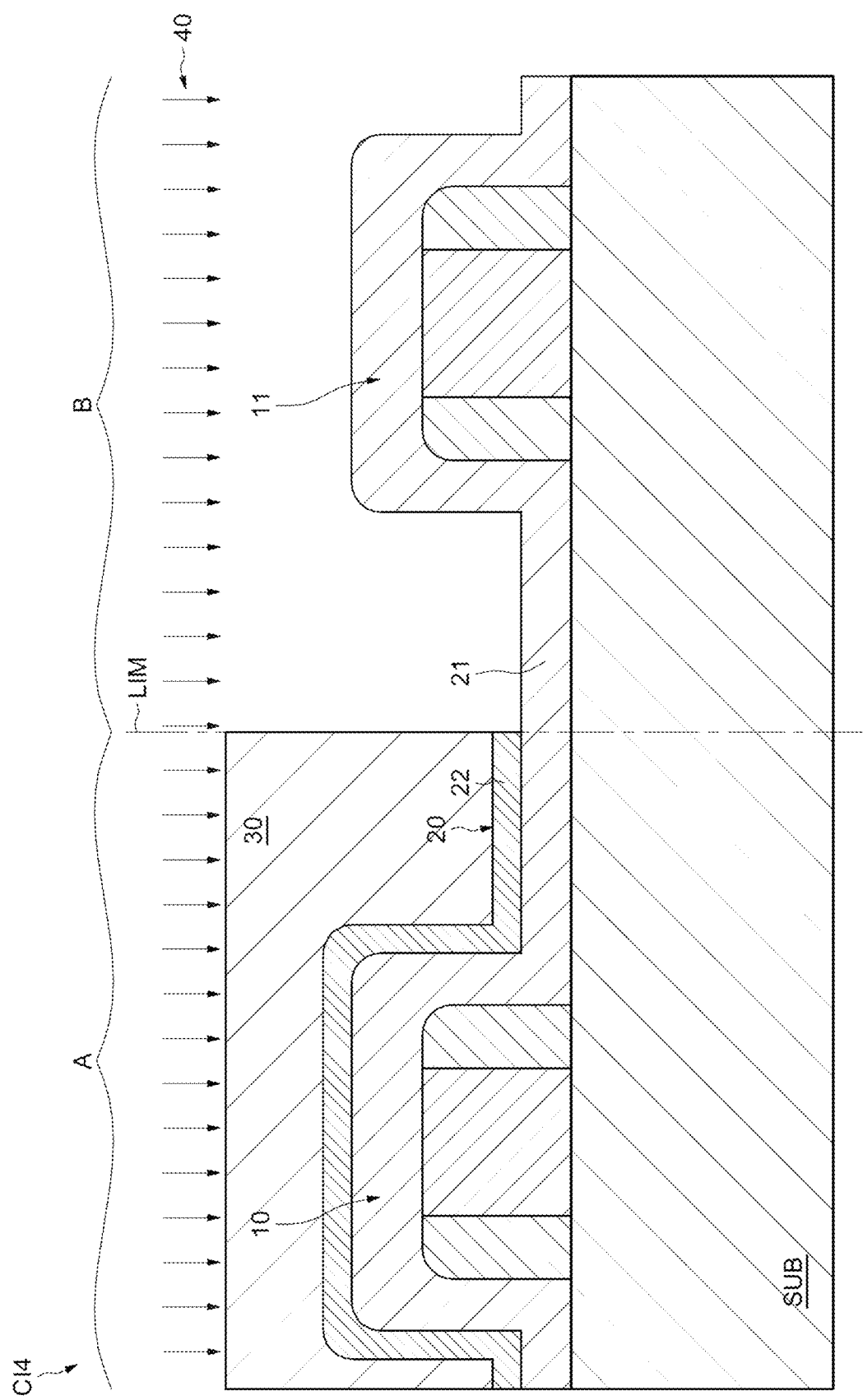

FIG. 4 represents an intermediate semiconductor device structure CI4, corresponding to the structure CI3 undergoing a removal of the nitride layer 22.

The silicon nitride layer 22 which is not covered by the mask 30 is removed by a selective etching 40. The selective etching 40 is configured to attack the silicon nitride 22 but not to react, or react very little, with the silicon oxide 21.

The etching 40 may be of dry ion-beam etching type.

Figure 5:
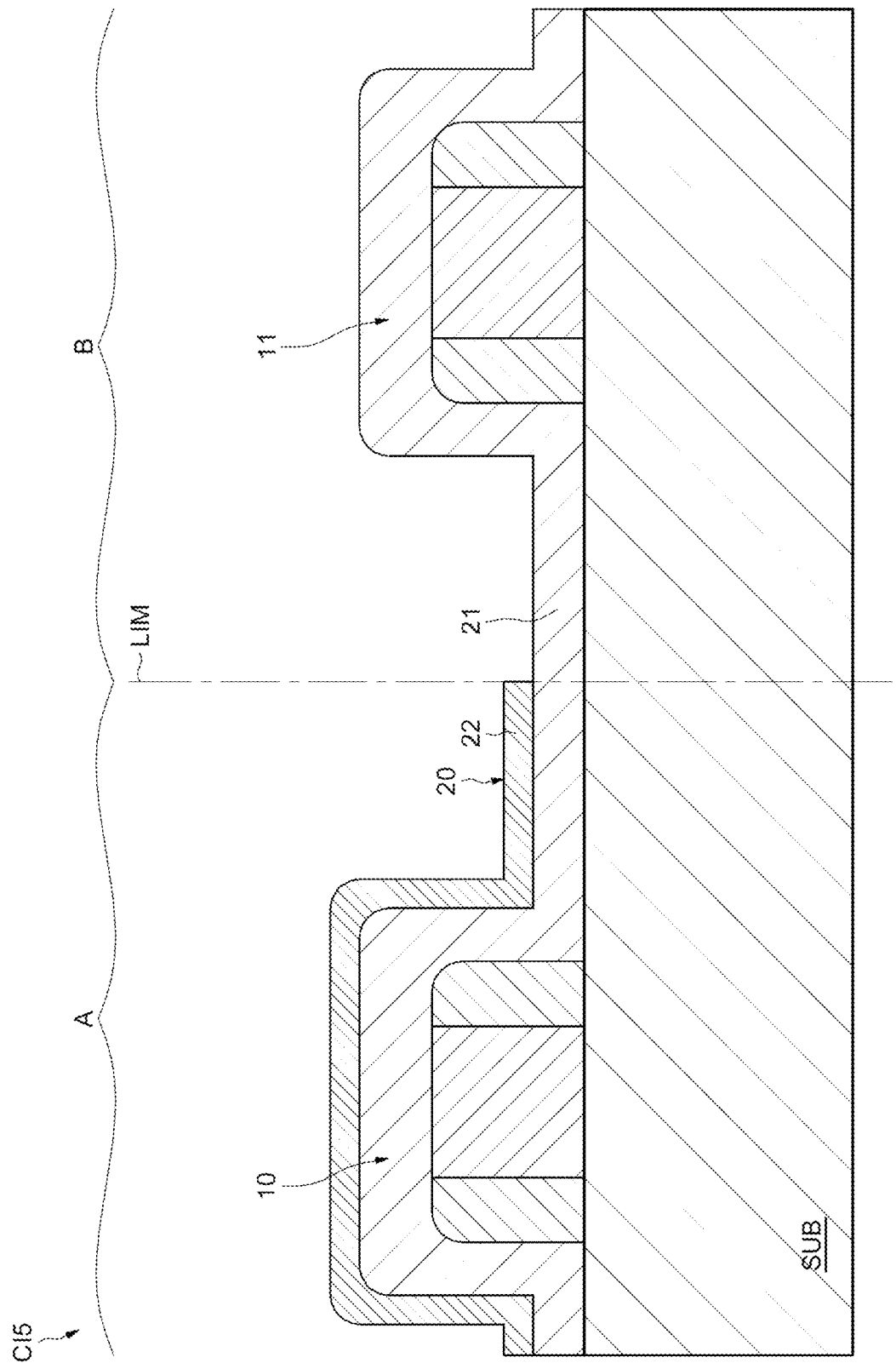

FIG. 5 represents an intermediate semiconductor device structure CI5, corresponding to the structure CI4 from which the mask 30 has been removed.

Following the removal of the mask 30, the structure CI5 comprises a silicon oxide layer 21 over the entire surface, and a silicon nitride layer 22 only on the part not to be silicided (part A).

The nitride layer 22 will serve as a hardmask for a removal of the silicon oxide layer 21 on the part to be silicided B.

Figure 6:
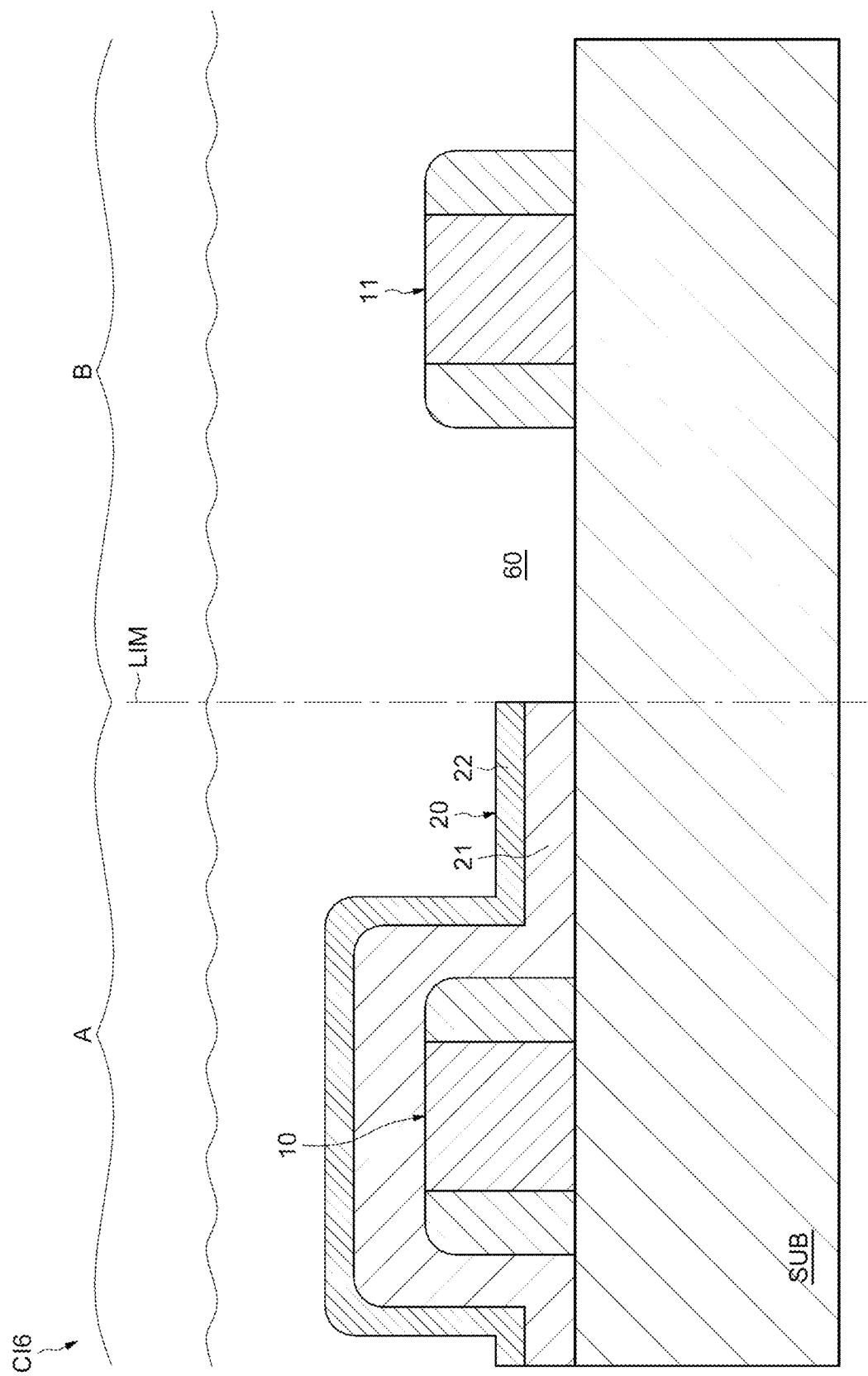

FIG. 6 represents an intermediate semiconductor device structure CI6, corresponding to the structure CI5 undergoing a removal of the oxide layer 21.

A wet etching 60 is configured to selectively attack the silicon oxide 21 and not to react, or react very little, with the silicon nitride 22. Thus the part of the silicon oxide layer 21 which is not covered by the hardmask of silicon nitride 22 is dissolved.

For example the wet etching 60 comprises a hydrofluoric acid bath.

Thus, on the intermediate semiconductor device structure CI6, the protective layer 20 has been completely removed from the part to be silicided B and has remained unchanged on the part not to be silicided A.

Figure 7:
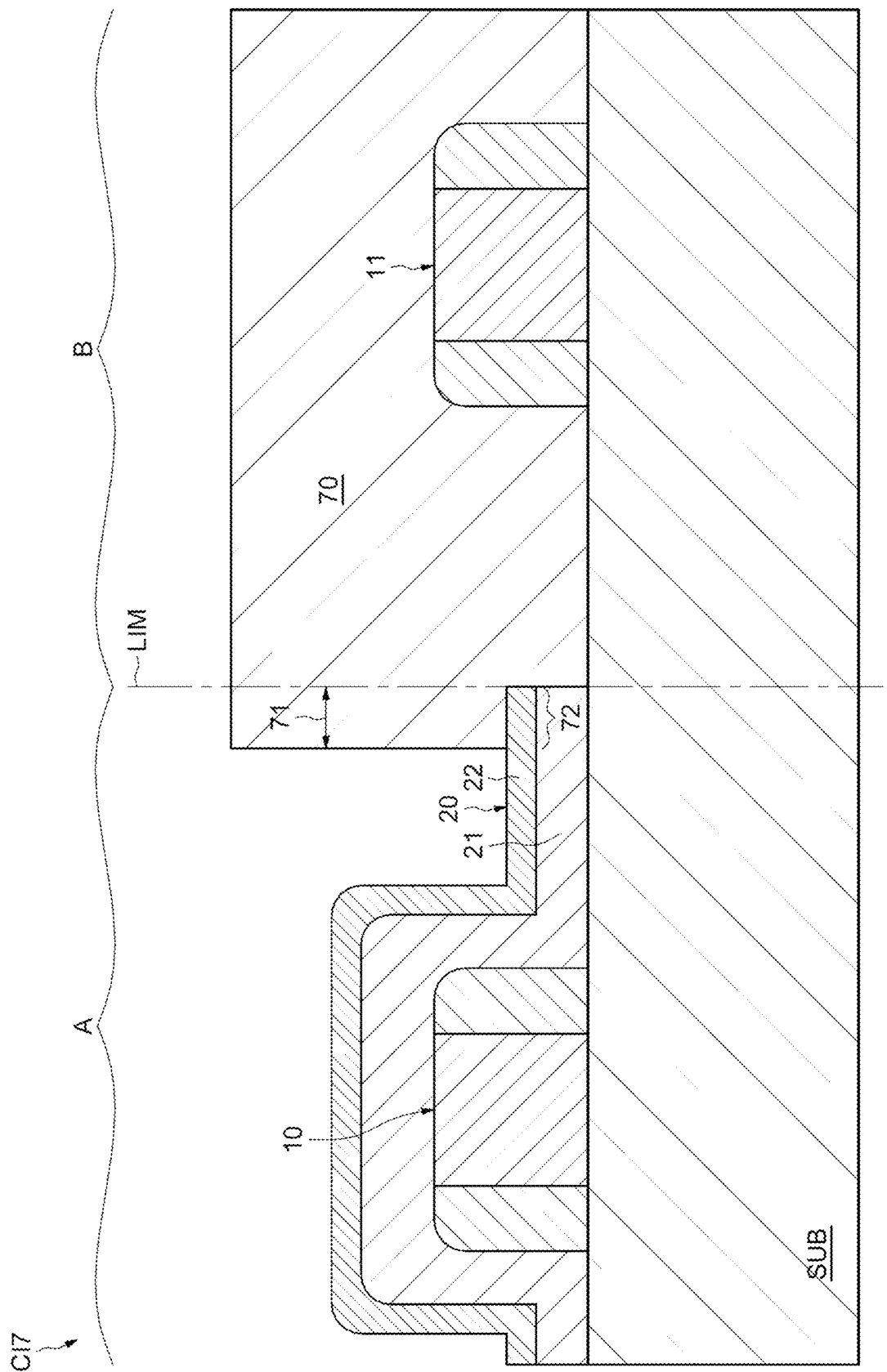

FIG. 7 represents an intermediate semiconductor device structure CI7, corresponding to the structure CI6 on which a second mask 70 has been formed.

The mask 70 has been formed by means of a lithographed photoresist, in order to cover the part to be silicided B and to leave uncovered the protective layer 20 of the part not to be silicided A.

That being so, a perfect alignment on the boundary LIM is not essential, and the second mask 70 may go beyond 71 the boundary LIM on the side of the part not to be silicided A and overlap a border 72 of the protective layer 20 remaining. The border 72 of the protective layer 20 is thus located on the protective layer 20 at the boundary LIM between the parts A and B.

According to one alternative, the second mask 70 may stop before the boundary LIM, on the side of the part to be silicided B. That being so, a subsequent etching, described below in connection with FIG. 8, could deteriorate the uncovered part of the substrate SUB and this may be disadvantageous.

Figure 8:
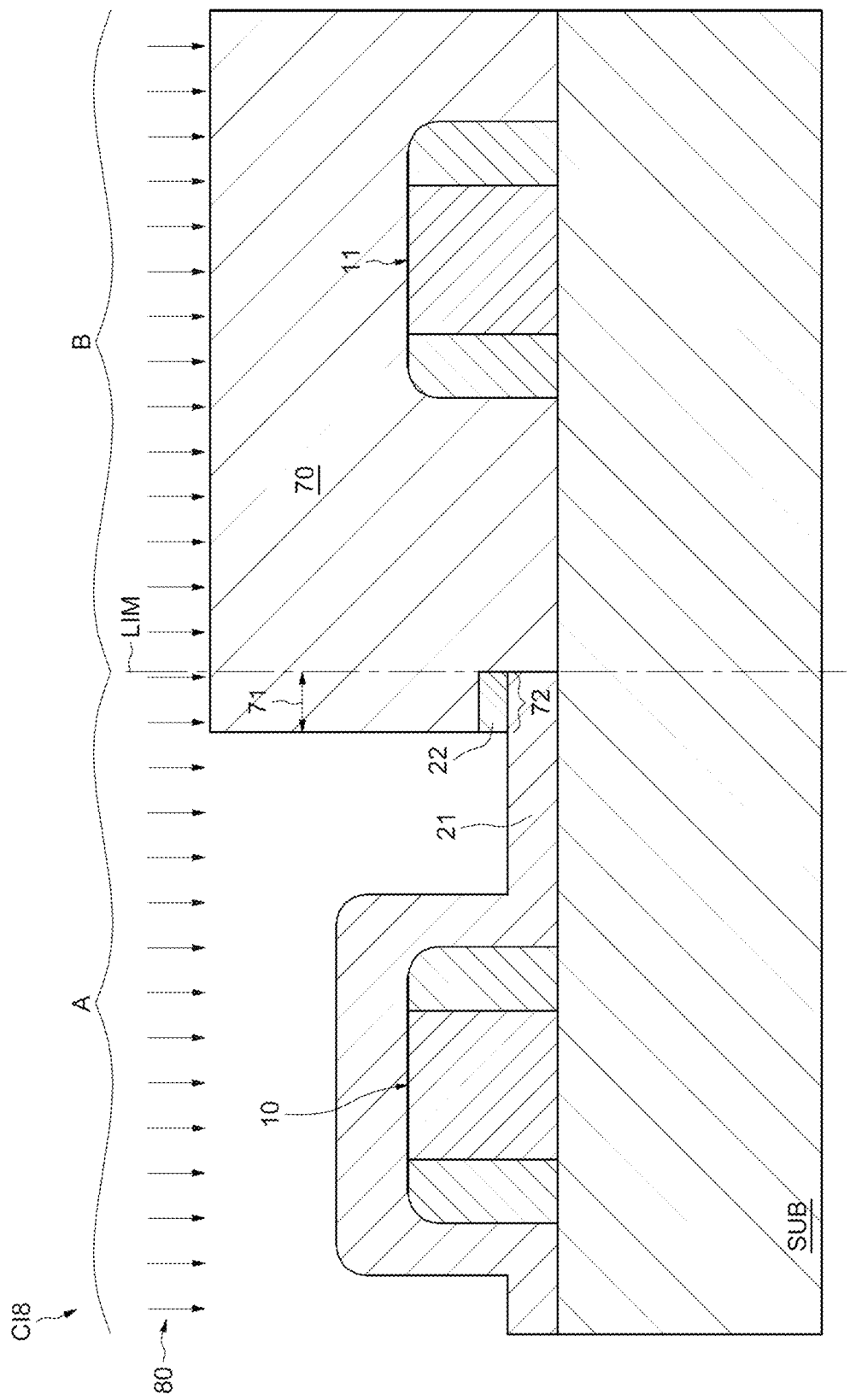

FIG. 8 represents an intermediate semiconductor device structure CI8, corresponding to the structure CI7 undergoing a removal of the nitride layer 22.

A selective etching 80, for example the same etching as the selective etching 40 described above in connection with FIG. 4, makes it possible to remove the silicon nitride layer 22 which is not covered by the second mask 70.

Thus, the silicon nitride layer 21 is removed over a portion of the surface of the protective layer 20, i.e. the entire surface of the protective layer 20 of the part not to be silicided A, except the border 72 covered by the second mask 70.

The remaining part of the silicon nitride layer 22 represents for example less than 50% of the total surface area of the semiconductor device.

Figure 9:
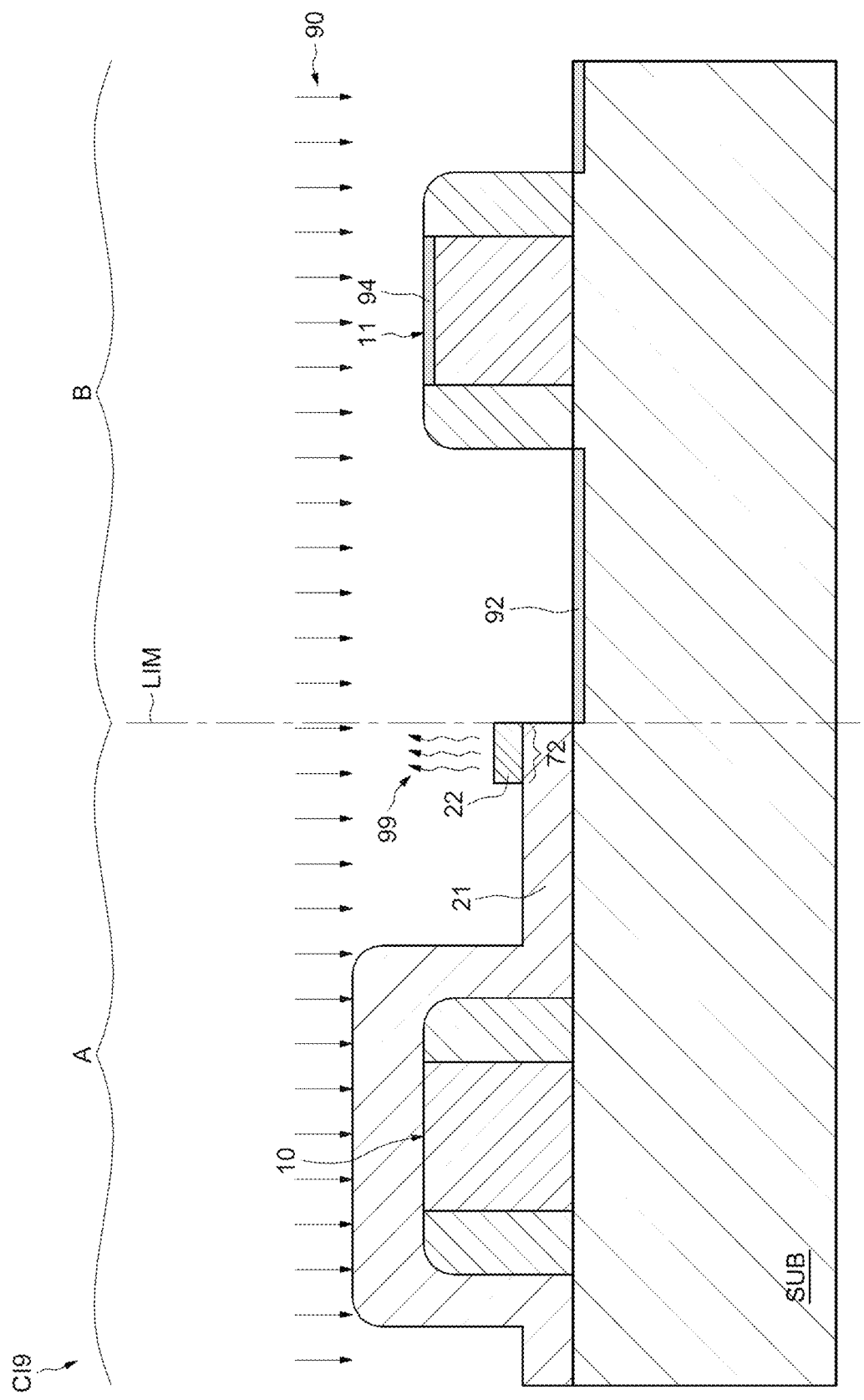

FIG. 9 represents an intermediate semiconductor device structure CI9, corresponding to the structure CI8 from which the mask 70 has been removed and which is undergoing a soft cleaning etching 90.

Cleaning of the uncovered surfaces is carried out by means of a soft etching 90 by ion sputtering in a plasma environment, usually denoted by the acronym SSE for the standard term Soft Sputter Etch.

Soft etching 90 comprises argon ion sputtering in a molecular oxygen plasma environment.

This soft etching 90 is intended to remove parasitic oxidations or masking resist residues, on silicon surfaces, for example surfaces 92 of the substrate SUB or surfaces 94 of gate elements (13) made of polycrystalline silicon.

Parasitic oxidations could for example have appeared during phases of moving a silicon wafer between two reactors.

That being so, this ion sputtering 90 also reacts with the silicon nitride 21, which then releases molecular nitrogen in the gas phase 99. A certain amount of molecular nitrogen may destabilize the molecular oxygen plasma to the extent of destroying the equilibrium thereof.

This scenario may appear in particular in systems for fabricating image sensors, which may comprise a protective layer 20 on up to 90% of the total surface area of the semiconductor device.

In particular, the semiconductor devices intended to be stacked in order to form a three-dimensional structure are liable to have protective layers 20 occupying a high enough surface area so that a This is for example the case for the integrated circuits of image sensors, in which a first semiconductor device exclusively devoted to the photoreaction is connected "bare" to a second semiconductor device devoted in particular to signal processing. The term "bare" is understood to mean that the semiconductor devices to be assembled do not comprise a customary encapsulating or connector structure of marketable integrated circuits.

However, the intermediate semiconductor device structure CI9 according to this mode of implementation has only a minor part of silicon nitride 22, on the border of the protective layer 20, during the cleaning by soft etching 90.

It is reasonable to consider that a silicon nitride layer having a thickness of the order of 10 nm over at most 50% of the total surface area of the semiconductor device will produce sufficiently little molecular nitrogen so as not to destroy the equilibrium of a molecular oxygen plasma.

Of course, the ratio of 50% of the total surface area of the semiconductor device is an approximation. The actual maximum amount of surface area occupied by the silicon nitride layer will depend in particular on the industrial conditions of the implementation of the ion sputtering in a plasma environment.

In any case, the step of removal 80 of a portion of the silicon nitride layer 22 is arranged so that the remaining portion 72 of the silicon nitride layer 21 occupies a small enough surface area so that the equilibrium of the plasma environment is not destroyed by the release of molecular nitrogen, for example a surface area of less than 50% of the total surface area of the semiconductor device.

Thus, this mode of implementation has no risk of interruption of the soft ion sputtering etching 90 due to this release of molecular nitrogen 99.

Figure 10:
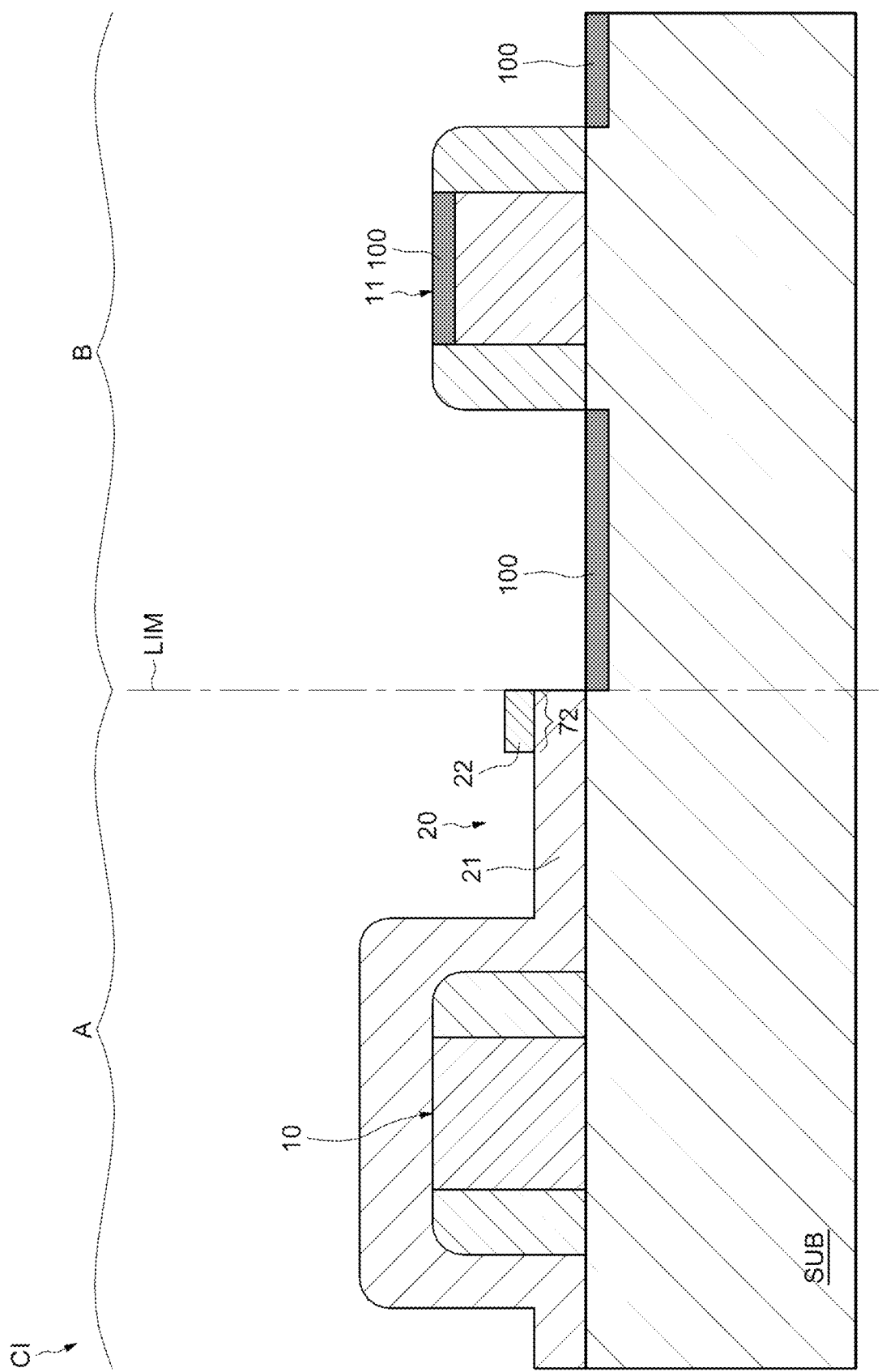

FIG. 10 represents a semiconductor device structure CI, corresponding to the structure CI9 on which a silicidation is carried out.

A physical vapor deposition of a metal, preferentially cobalt, is carried out on the intermediate structure CI9, and a surface film of metal silicide 100 is formed on the bare silicon surfaces.

Thus, the bare silicon surfaces which are not covered by what remains of the protective layer 20, i.e., in the part to be silicided B, react to give metal silicide 100.

The semiconductor device elements 11 silicided may then be coupled together by metal interconnections.

At the end of these steps of the process for siliciding surfaces of a semiconductor device CI, a semiconductor device comprising a silicided part B having a surface film of metal silicide 100, and a non-silicided part A having no metal silicide film but being covered with a silicon oxide layer 21 was obtained.

The semiconductor device thus obtained comprises a silicon nitride layer 22 resting on a border 72 of the silicon oxide layer 21 at the boundary LIM between the non-silicided part A and the silicided part B.

Such a semiconductor device may thus have quality silicided films and improved electrical contacts on these silicided films.

Furthermore, the invention is not limited to these modes of implementation and embodiments but embraces all variants thereof, for example other reactions, etchings and maskings may be used while benefiting from the advantage as regards release of gas in a plasma environment.

What is claimed is:
1. A semiconductor device comprising:
  a semiconductor body;

a first gate structure overlying a surface of the semiconductor body, the first gate structure being silicided;

a second gate structure overlying the surface of the semiconductor body, the second gate structure not being silicided;

an oxide layer overlying the second gate structure and extending toward the first gate structure; and a silicon nitride region laterally spaced from the second gate structure and overlying a portion of the oxide layer between the first gate structure and the second gate structure, wherein the silicon nitride region occupies a surface area of less than 50% of a total surface area of the semiconductor body.

2. The semiconductor device according to claim 1, wherein an edge of the silicon nitride region coincides with an edge of the oxide layer between the first gate structure and the second gate structure.

3. The semiconductor device according to claim 1, wherein the semiconductor device is an image sensor integrated circuit.

4. A semiconductor device comprising:

a semiconductor body;

a first gate structure disposed over the semiconductor body in a first region of the semiconductor body;

a first silicide region disposed proximate the first gate structure in the first region;

a second gate structure disposed over the semiconductor body in a second region of the semiconductor body, the second region contacting the first region;

an oxide layer disposed over the second gate structure and extending toward the first gate structure to an edge between the first region and the second region; and a silicon nitride region disposed, at the edge, over a portion of the oxide layer, wherein the silicon nitride region occupies a surface area of less than 50% of a total surface area of the semiconductor body.

5. The semiconductor device according to claim 4, further comprising a second silicide region disposed over the first gate structure, the second gate structure not being silicided.

6. The semiconductor device according to claim 4, wherein the silicon nitride region is laterally spaced from the second gate structure and disposed between the first gate structure and the second gate structure.

7. The semiconductor device according to claim 4, wherein an edge of the silicon nitride region coincides with an edge of the oxide layer between the first gate structure and the second gate structure.

8. The semiconductor device according to claim 4, wherein the semiconductor device is an image sensor integrated circuit.

9. A semiconductor device comprising:

a first polycrystalline silicon gate disposed over a semiconductor body in a first region of the semiconductor body;

a first silicide region disposed proximate the first polycrystalline silicon gate in the first region;

a first sidewall spacer disposed on sidewalls of the first polycrystalline silicon gate, the first sidewall spacer disposed between the first silicide region and the first polycrystalline silicon gate;

a second silicide region disposed on the first polycrystalline silicon gate;

a second polycrystalline silicon gate disposed over the semiconductor body in a second region of the semiconductor body, the second region contacting the first region;

a second sidewall spacer disposed on sidewalls of the second polycrystalline silicon gate; and an oxide layer disposed over the second polycrystalline silicon gate and the second sidewall spacer, the oxide layer physically contacting a major surface of the second polycrystalline silicon gate, the oxide layer extending to an edge between the first region and the second region; and a silicon nitride region disposed, at the edge, over a portion of the oxide layer, wherein the silicon nitride region occupies a surface area of less than 50% of a total surface area of the semiconductor body.

10. The semiconductor device according to claim 9, wherein the silicon nitride region is laterally spaced from the second polycrystalline silicon gate and disposed between the first polycrystalline silicon gate and the second polycrystalline silicon gate.

11. The semiconductor device according to claim 9, wherein an edge of the silicon nitride region coincides with an edge of the oxide layer at the edge between the first region and the second region.

12. The semiconductor device according to claim 9, wherein the semiconductor device is an image sensor integrated circuit.

* * * * *